US011238904B1

(12) United States Patent
Yu et al.

(10) Patent No.: US 11,238,904 B1
(45) Date of Patent: Feb. 1, 2022

(54) USING EMBEDDED SWITCHES FOR REDUCING CAPACITIVE LOADING ON A MEMORY SYSTEM

(71) Applicant: Taiwan Semiconductor Manufacturing Company Limited, Hsinchu (TW)

(72) Inventors: Chia-Ta Yu, Hsinchu (TW); Chia-En Huang, Xinfeng Township (TW); Sai-Hooi Yeong, Zhubei (TW); Yih Wang, Hsinchu (TW); Yi-Ching Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/103,767

(22) Filed: Nov. 24, 2020

(51) Int. Cl.
  *G11C 7/10* (2006.01)
  *G11C 7/02* (2006.01)
  *G11C 7/18* (2006.01)
  *G11C 8/14* (2006.01)
  *G11C 8/08* (2006.01)
  *G11C 7/12* (2006.01)

(52) U.S. Cl.
  CPC ............. *G11C 7/02* (2013.01); *G11C 7/12* (2013.01); *G11C 7/18* (2013.01); *G11C 8/08* (2013.01); *G11C 8/14* (2013.01)

(58) Field of Classification Search
  CPC ..... G11C 7/02; G11C 7/12; G11C 7/18; G11C 8/08; G11C 8/14
  USPC ...................................................... 365/189.17
  See application file for complete search history.

(56) References Cited

U.S. PATENT DOCUMENTS

2009/0207642 A1* 8/2009 Shimano ............. G11C 11/1675
                                                    365/72
2021/0232744 A1* 7/2021 Lin ........................ H01L 25/18

\* cited by examiner

*Primary Examiner* — Huan Hoang
(74) *Attorney, Agent, or Firm* — Foley & Lardner LLP (57) ABSTRACT

Systems and methods disclosed herein are related to a memory system. In one aspect, the memory system includes a first set of memory cells and a second set of memory cells; a first group of switches, each including: a first electrode connected to first electrodes of the first subset of memory cells, and a second electrode; a second group of switches, each including: a first electrode connected to first electrodes of the second subset of memory cells, and a second electrode; and a third group of switches, each including: a first electrode connected to a first global bit line, and a second electrode connected to the second electrodes of the first group of switches and the second electrodes of the second group of switches.

20 Claims, 9 Drawing Sheets

FIG. 7

USING EMBEDDED SWITCHES FOR REDUCING CAPACITIVE LOADING ON A MEMORY SYSTEM

TECHNICAL FIELD

The disclosure relates generally to high density memory devices, and more particularly, to memory devices in which multiple planes of memory cells are arranged to provide a three-dimensional (3D) array including switches to reduce bit line (BL) and/or select line (SL) capacitance.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

SUMMARY

The example embodiments disclosed herein are directed to solving the issues relating to one or more of the problems presented in the prior art, as well as providing additional features that will become readily apparent by reference to the following detailed description when taken in conjunction with the accompany drawings. In accordance with various embodiments, example systems, methods, devices and computer program products are disclosed herein. It is understood, however, that these embodiments are presented by way of example and are not limiting, and it will be apparent to those of ordinary skill in the art who read the present disclosure that various modifications to the disclosed embodiments can be made while remaining within the scope of this disclosure.

BRIEF DESCRIPTION OF THE DRAWINGS

Various example embodiments of the present solution are described in detail below with reference to the following figures or drawings. The drawings are provided for purposes of illustration only and merely depict example embodiments of the present solution to facilitate the reader's understanding of the present solution. Therefore, the drawings should not be considered limiting of the breadth, scope, or applicability of the present solution. It should be noted that for clarity and ease of illustration, these drawings are not necessarily drawn to scale.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes one or more switches (sometimes referred to as, "select gates") to couple or decouple local lines to a global line. A local line may be a metal rail, to which two or more memory cells are connected. For example, a local line may be a local select line (e.g., LSL[00] in FIG. 3A), to which first electrodes (e.g., drain (or source) electrodes) of memory cells are connected. For example, a local line may be a local bit line (e.g., LBL[00] in FIG. 3A), to which second electrodes (e.g., source (or drain) electrodes) of the memory cells are connected. A global line may be a metal rail, to which one or more of selected local lines can be electrically coupled through switches. For example, a global line may be a global select line (e.g., GSL[0] in FIG. 3A), to which two or more local select lines can be electrically coupled through switches. For example, a global line may be a global bit line (e.g., GBL[0] in FIG. 3A), to which two or more local bit lines can be electrically coupled through switches.

Advantageously, the memory system employing the disclosed switches can achieve several benefits. In one aspect, switches between a global line and local lines can be individually configured or operated to electrically couple or decouple respective local lines to the global line. By coupling a selected local line to a global line, a subset of a set of memory cells connected to the selected local line can be electrically coupled to the global line while the other subset of the set of memory cells connected to unselected local lines can be electrically decoupled from the global line. Hence, the global line may have a capacitive loading corresponding to the selected subset of the set of memory cells instead of a capacitive loading corresponding to the entire set of memory cells. Accordingly, the set of memory cells having many memory cells can be configured or operated through a global line with a low capacitive loading corresponding to the subset of the set of memory cells.

By reducing the capacitive loading, operating speed of the memory system can be improved, which in turn, reduces the power consumption of the memory system. Moreover, the techniques and/or features of the present disclosure may also improve shielding between bit lines and/or select lines and decrease routing complexity.

1. Memory Architecture

Figure 1:
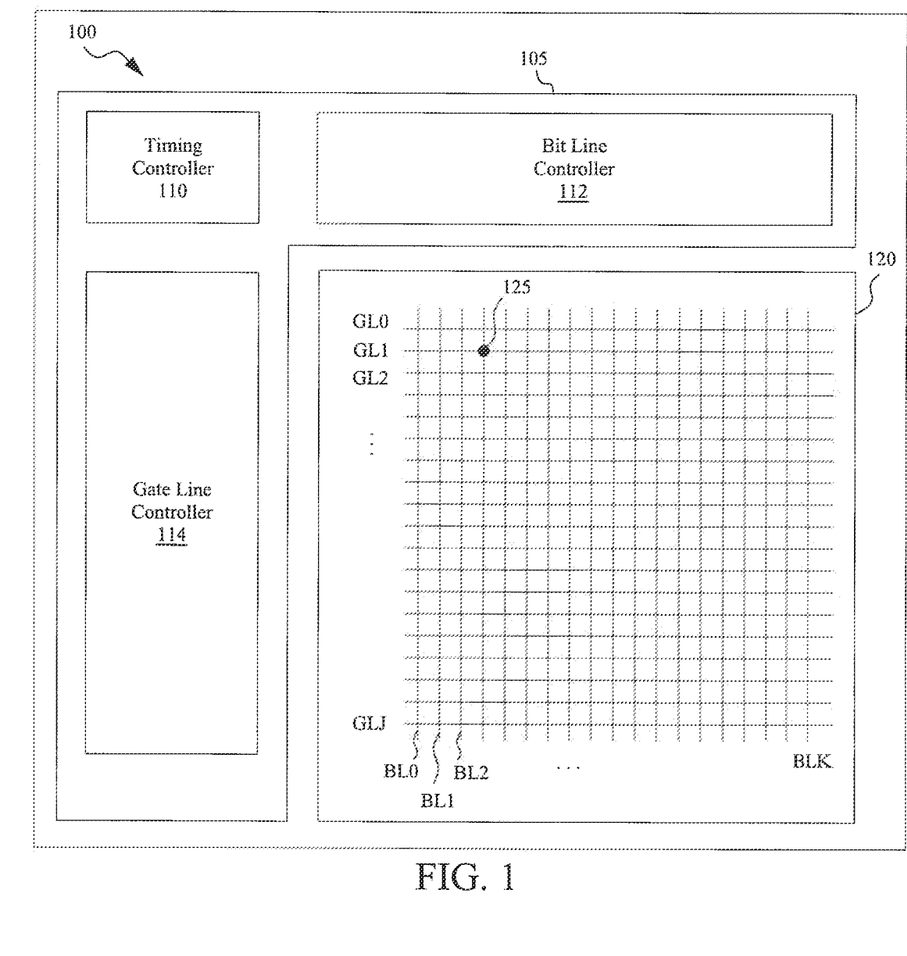
FIG. 1 is a diagram of a memory system, in accordance with an embodiment of the present disclosure.

FIG. 1 is a diagram of a memory system 100, in accordance with an embodiment of the present disclosure. In some embodiments, the memory system 100 is implemented as an integrated circuit. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. In some embodiments, the memory array 120 includes gate lines GL0, GL1 . . . GLJ, each extending in a first direction and bit lines BL0, BL1 . . . BLK, each extending in a second direction. The gate lines GL and the bit lines BL may be conductive metals or conductive rails. Each gate line GL may include a word line and control lines. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a non-volatile memory cell. In some embodiments, the memory array 120 includes additional lines (e.g., sense lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more sense lines. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL and sense lines of the memory array 120, and the gate line controller 114 may be connected to gate lines GL of the memory array 120. In one example, to write data to a memory cell 125, the gate line controller 114 applies a voltage or current to the memory cell 125 through a gate line GL connected to the memory cell 125, and the bit line controller 112 applies a voltage or current corresponding to data to be stored to the memory cell 125 through a bit line BL connected to the memory cell 125. In one example, to read data from a memory cell 125, the gate line controller 114 applies a voltage or a current to the memory cell 125 through a gate line GL connected to the memory cell 125, and the bit line controller 112 senses a voltage or current corresponding to data stored by the memory cell 125 through a sense line or a bit line connected to the memory cell 125. In some embodiments, the memory controller 105 includes more, fewer, or different components than shown in FIG. 1.

Figure 2:
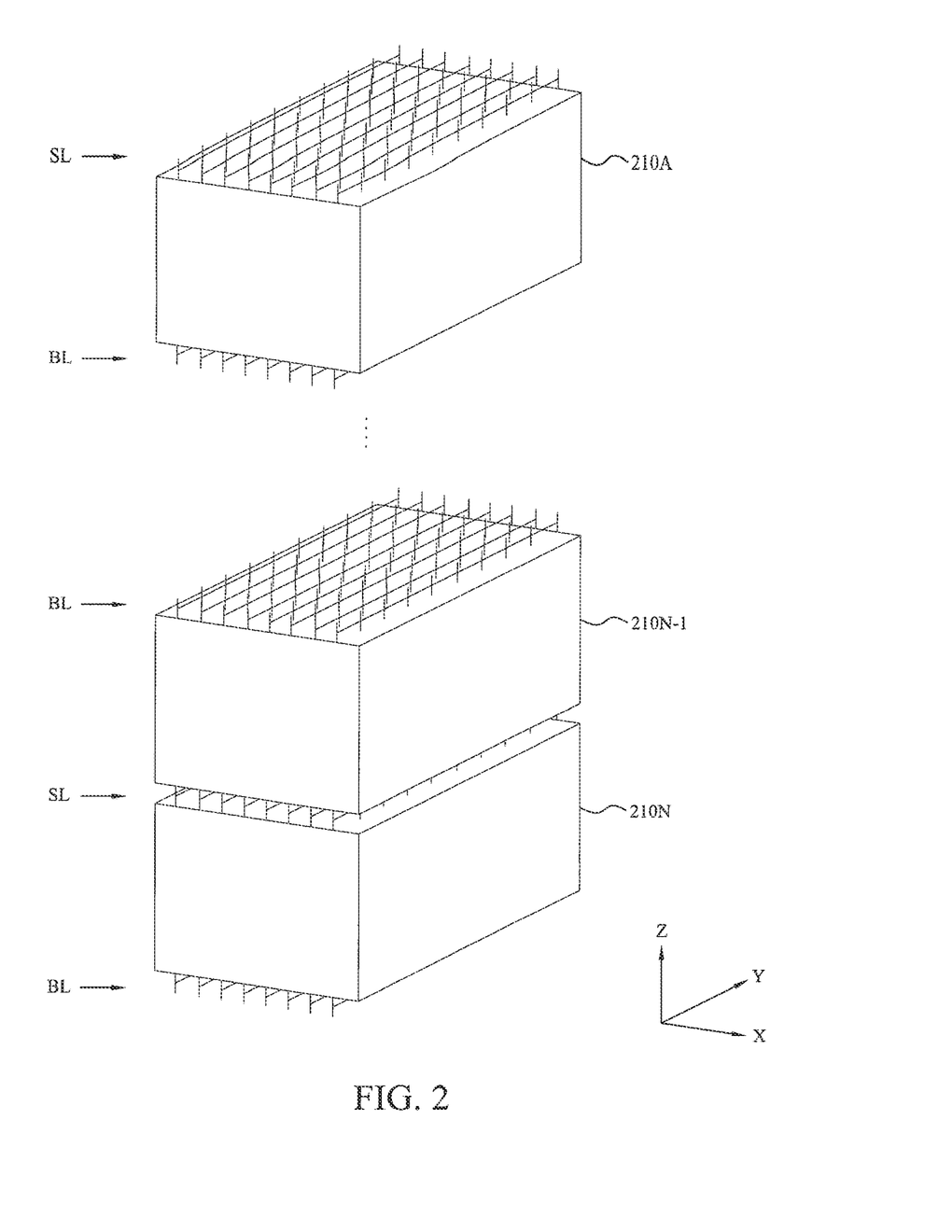
FIG. 2 is a diagram showing three-dimensional memory arrays, in accordance with an embodiment of the present disclosure.

FIG. 2 is a diagram showing three-dimensional memory arrays 210A . . . 210N, in accordance with one embodiment. In some embodiments, the memory array 120 includes the memory arrays 210A . . . 210N. Each memory array 210 includes a plurality of memory cells 125 arranged in a three-dimensional array. In some embodiments, each memory array 210 may include a same number of memory cells 125. In some embodiments, two or more memory arrays 210 may include different numbers of memory cells 125. In one configuration, the memory arrays 210A . . . 210N are stacked along a Z-direction. Each memory array 210 may have bit lines BL on one side of the memory array 210 and have select lines SL on an opposite side of the memory array 210. In some embodiments, two adjacent memory arrays 210 may share select lines SL. In some embodiments, two adjacent memory arrays 210 may share bit lines BL. For example, memory arrays 210N-1, 210N share or are electrically coupled to a set of select lines SL. For example, memory arrays 210N-2, 210N-1 share or are electrically coupled to a set of bit line BL. By sharing select lines SL and/or bit lines BL, a number of drivers of the memory controller 105 to apply signals through the select lines SL and/or bit lines BL can be reduced to achieve area efficiency. In some embodiments, the memory array 120 includes additional memory arrays that may have separate select lines SL and/or bit lines BL than shown in FIG. 2.

2. Memory System(s) with Embedded Switches

Figure 3A:
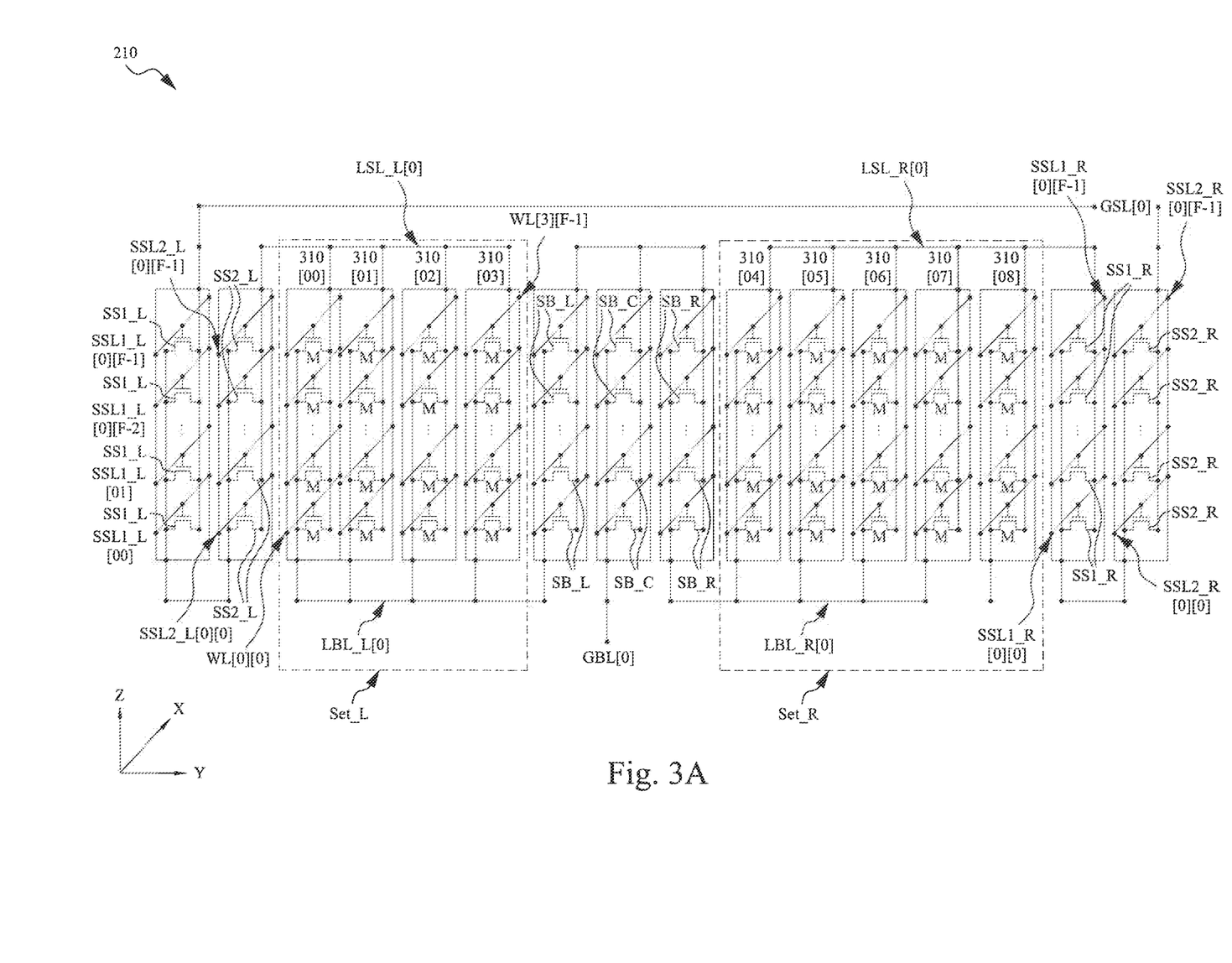
FIG. 3A is a diagram showing a portion of a three-dimensional memory array 210 including switches coupled to global bit lines GBL and global select lines GSL for reducing capacitive loading, in accordance with one embodiment.

FIG. 3A is a diagram showing a portion of a three-dimensional memory array 210 including switches (sometimes referred to as "selectors") coupled to global bit lines GBL and global select lines GSL for reducing capacitive loading, in accordance with one embodiment. In FIG. 3A, the memory array may include (e.g., embedded, implanted, entrenched) a group of switches SS_L (sometimes referred to as "switches SS_L"), a group of switches SS_R (sometimes referred to as, "switches SS_R"), and/or a group of switches SB (sometimes referred to as "switches SB"). The memory array 210 may include a first set of memory cells (e.g., shown in FIG. 3A as "Set_L") and a second set of memory cells (shown in FIG. 3A as "Set_R"). In one configuration, the first set of memory cells includes subsets 310[00] . . . 310[03] of memory cells that may be electrically coupled via the group of switches SB to a global bit line GBL[0] that extends along a Y-direction, and coupled via the group of switches SS_L to a global select line GSL[0] that also extends along the Y-direction. In one configuration, the second set of memory cells includes subsets 310[04] . . . 310[08] of memory cells that may be electrically coupled via the group of switches SB to global bit line GBL[0], and coupled via the group of switches SS_R to global select line GSL[0].

Each subset 310 of memory cells may include F number of memory cells M (e.g., memory cell 125 in FIG. 1) disposed along a Z-direction, where F also corresponds to a total number of floors or layers in the memory array 210. Each set of memory cells (e.g., Set_R, Set_L) may include a larger number of subsets 310 of memory cells than shown in FIG. 3A along the Y-direction. The memory array 210 may include a larger number of sets of memory cells than shown in FIG. 3A stacked along the X-direction. By arranging memory cells as shown in FIG. 3A, a storage density of the memory array 210 can be increased.

In one configuration, one or more switches of the group (e.g., network, collection, plurality) of switches SS_L may be positioned on the left side of the group of switches SS_L and the other switches of the group of switches may be positioned on the right side of the group of switches SS_L. In one configuration, the group of switches SS_L may include a first vertical string of switches SS_L (shown in FIG. 3A as "SS1_Ls") disposed along a Z-direction and a second vertical string of switches SS_L (shown in FIG. 3A as "SS2_Ls") disposed along the Z-direction. In one configuration, the first vertical string of switches SS_L are positioned on the left side of the group of switches SS_L and the second vertical string of switches SS_L are positioned on the right side of the group of switches SS_L such that the first and second vertical strings are in parallel (or side-by-side) with one another.

Each switch SS_L in the group of switches SS_L may be identified (e.g., indexed, referenced, labeled, etc.) according to its position in the group of switches and its X-Y-Z position in the memory array 210. For example, as shown in FIG. 3A, the first vertical string of switches SS_L includes SS1_L [0][0][0], SS1_L [0][0][1], SS1_L [0][0][F−2], and SS1_L [0][0][F]; and the second vertical string of switches SS_L includes SS2_L [0][0][0], SS2_L [0][0][1], SS2_L [0][0][F−2], and SS2_L [0][0][F].

In one configuration, one or more switches of the group of switches SS_R may be positioned on the left side of the group of switches SS_R and the other switches of the group of switches may be positioned on the right side of the group of switches SS_R. In one configuration, the group of switches SS_R may include a first vertical string of switches SS_R (shown in FIG. 3A as "SS1_Rs") disposed along a Z-direction and a second vertical string of switches SS_R (shown in FIG. 3A as, "SS2_Rs") disposed along the Z-direction. In one configuration, the first vertical string of switches SS_R are positioned on the left side of the group of switches SS_R and the second vertical string of switches SS_R are positioned on the right side of the group of switches SS_R such that the first and second vertical strings are in parallel (or side-by-side) with one another.

Each switch SS_R in the group of switches SS_R may be identified (e.g., indexed, referenced, labeled, etc.) according to its position in the group of switches and its X-Y-Z position in the memory array 210. For example, as shown in FIG. 3A, the first vertical string of switches SS_R includes SS1_R [0][0][0], SS1_R [0][0][1], SS1_R [0][0][F−2], and SS1_R [0][0][F]; and the second vertical string of switches SS_R includes SS2_R [0][0][0], SS2_R [0][0][1], SS2_R [0][0][F−2], and SS2_R [0][0][F].

In one configuration, one or more switches SB of the group of switches SB may be positioned on the left side of the group of switches SB, the right side of the group of switches SB, or in the center (i.e., where other switches are to the left and other switches are to the right) of the group of switches. In one configuration, the group of switches SB may include a first vertical string of switches SB (shown in FIG. 3A as, "SB_Ls") disposed along a Z-direction, a second vertical string of switches SB (shown in FIG. 3A as, "SB_Cs") disposed along the Z-direction, and a third vertical string of switches SB (shown in FIG. 3A as, "SB_Rs") disposed along the Z-direction. In one configuration, the first vertical string of switches SB are positioned on the left side of the group of switches SB, the second vertical string of switches SB are positioned in the center of the group of switches SB, and the third vertical string of switches are positioned on the right side of the group of switches SB such that the first, second, and third vertical strings are in parallel (or side-by-side) with one another.

Each switch SB in the group of switches SB may be identified (e.g., indexed, referenced, labeled, etc.) according to its position in the group of switches and its X-Y-Z position in the memory array 210. For example, as shown in FIG. 3A, the first vertical string of switches SB includes SB_L [0][0][0], SB_L [0][0][1], SB_L [0][0][F−2], and SB_L [0][0][F]; the second vertical string of switches SB includes SB_C [0][0][0], SB_C [0][0][1], SB_C [0][0][F−2], and SB_C [0][0][F]; and the third vertical string of switches SB includes SB_R [0][0][0], SB_R [0][0][1], SB_R [0][0][F−2], and SB_R [0][0][F].

Each memory cell M may be a volatile memory cell, a non-volatile memory cell, or any memory cell that can store data. Each memory cell M may be embodied as a transistor, such as a metal-oxide-semiconductor field effect transistor (MOSFET), a gate-all-around FET (GAAFET), or a fin field-effect transistor (FinFET). Each memory cell M may include a first electrode (e.g., drain electrode) coupled to a local select line LSL (e.g., LSL_L[X] or LSL_R[X]), a second electrode (e.g., source electrode) coupled to a local bit line LBL (e.g., LBL_L[X] or LBL_R[X]), and a third electrode (e.g., gate electrode) coupled to a corresponding word line (e.g., word line WL[X][Z]). Each memory cell M may store data or conduct current according to a voltage applied to a gate electrode of the memory cell M. A word line WL[X][Y] may extend along the X-direction to connect gate electrodes of corresponding memory cells M in different sets (e.g., Set_L, Set_R) to the memory controller (e.g., gate line controller 114).

In one configuration, a subset 310 of memory cells M are connected in parallel between a local select line LSL (e.g., LSL_L[X] or LSL_R[X]) and a local bit line LBL (e.g., LBL_L[X] or LBL_R[X]). A local select line LSL may be a metal rail, at which first electrodes (e.g., drain electrodes) of a subset 310 memory cells are connected. A local bit line LBL may be a metal rail, at which second electrodes (e.g., source electrodes) of a subset 310 memory cells are connected.

Referring to the first set of memory cells (e.g., Set_L) in FIG. 3A, subset 310[00] of memory cells M are connected in parallel between local select line LSL_L[0] and local bit line LBL_L[0]; subset 310[01] of memory cells M are connected in parallel between local select line LSL_L[0] and local bit line LBL_L[0]; subset 310[02] of memory cells M are connected in parallel between local select line LSL_L[0] and local bit line LBL_L[0]; and subset 310[03] of memory cells M are connected in parallel between local select line LSL_L[0] and local bit line LBL_L[0].

Referring to the first set of memory cells (e.g., Set_R) in FIG. 3A, subset 310[04] of memory cells M are connected in parallel between local select line LSL_R[0] and local bit line LBL_R[0]; subset 310[05] of memory cells M are connected in parallel between local select line LSL_R[0] and local bit line LBL_R[0]; subset 310[06] of memory cells M are connected in parallel between local select line LSL_R[0] and local bit line LBL_R[0]; subset 310[07] of memory cells M are connected in parallel between local select line LSL_R[0] and local bit line LBL_R[0]; and subset 310[08] of memory cells M are connected in parallel between local select line LSL_R[0] and local bit line LBL_R[0].

A local select line LSL (e.g., LSL_L, LSL_R) may extend along the Z-direction and connect to the group of switches SS_L or the group of switches SS_R. In one configuration, LSL_L[0] is connected to the second vertical string of switches SS_L (e.g., SS2_L [0][0][0], SS2_L [0][0][1], SS2_L [0][0][F-2], and SS2_L [0][0][F]) of the group of switches SS_L. In one configuration, subset 310[00] . . . 310[03] of memory cells M are connected to the second vertical string of switches SS_L via LSL_L[0].

In one configuration, LSL_R[0] is connected to the first vertical string of switches SS_L (e.g., SS1_R [0][0][0], SS1_R [0][0][1], SS1_R [0][0][F-2], and SS1_R [0][0][F]) of the group of switches SS_R. In one configuration, subset 310[00] . . . 310[03] of memory cells M are connected to the second vertical string of switches SS_L via LSL_L[0].

A local bit line LBL may extend along the Z-direction in parallel with the local bit line LBL and connect to the group of switches SB. In one configuration, LBL_L[0] is connected to the first vertical string of switches SB (e.g., SB_L [0][0][0], SB_L [0][0][1], SB_L [0][0][F-2], and SB_L [0][0][F]) of the group of switches SB. In one configuration, subset 310[00] . . . 310[03] of memory cells M are connected to the first vertical string of switches SB via LBL_L[0].

In one configuration, LSL_R[0] is connected to the third vertical string of switches SB (e.g., SB_R [0][0][0], SB_R [0][0][1], SB_R [0][0][F-2], and SB_R [0][0][F]) of the group of switches SB. In one configuration, subset 310[04] . . . 310[08] of memory cells M are connected to the third vertical string of switches SB via LBL_R[0].

Each switch SB (e.g., SB_L, SB_C, SB_R) may be embodied as a transistor (e.g., MOSFET, GAAFET, FinFET, etc.). Each switch of the first vertical string of switches SB (e.g., SB_L [0][0][0], SB_L [0][0][1], SB_L [0][0][F-2], and SB_L [0][0][F]) may include a first electrode (e.g., drain electrode) connected to the local bit line LBL (e.g., LBL_L [0]); a second electrode (e.g., source electrode) connected to second electrodes (e.g., source electrode) of the second vertical string of switches SB (e.g., SB_C [0][0][0], SB_C [0][0][1], SB_C [0][0][F-2], and SB_C [0][0][F]) and second electrodes (e.g., source electrode) of the third vertical string of switches SB (e.g., SB_R [0][0][0], SB_R [0][0][1], SB_R [0][0][F-2], and SB_R [0][0][F]); and a third electrode (e.g., gate electrode) connected to a corresponding switch control line SBL.

Each switch of the second vertical string of switches SB (e.g., SB_C [0][0][0], SB_C [0][0][1], SB_C [0][0][F-2], and SB_C [0][0][F]) may include a first electrode (e.g., drain electrode) connected to a global bit line GBL (e.g., GBL[0]); a second electrode (e.g., source electrode) connected to second electrodes (e.g., source electrode) of the first vertical string of switches SB and the third string of switches SB; and a third electrode (e.g., gate electrode) connected to a corresponding switch control line SBL.

Each switch of the third vertical string of switches SB (e.g., SB_R [0][0][0], SB_R [0][0][1], SB_R [0][0][F-2], and SB_R [0][0][F]) may include a first electrode (e.g., drain electrode) connected to the local bit line LBL (e.g., LBL_R [0]), a second electrode (e.g., source electrode) connected to second electrodes (e.g., source electrode) of the first vertical string of switches SB and the second string of switches SB; and a third electrode (e.g., gate electrode) connected to a corresponding switch control line SBL.

A switch control line SBL may be a metal rail extending along the X-direction to connect the memory controller 105 (e.g., gate line controller 114) to the gate electrodes of a corresponding switch SB. According to a voltage or a signal applied through the switch control line SBL, one or more switches SB connected to the switch control line SBL may be toggled (e.g., enabled or disabled).

In one configuration, in response to a voltage corresponding to logic state '1' provided through the switch control line SBL, a switch SB in the second vertical string of switches SB (e.g., SB_C [0][0][0], SB_C [0][0][1], SB_C [0][0][F-2], and SB_C [0][0][F]) may be enabled to electrically couple (e.g., connect, engage, etc.) second electrodes (e.g., source electrodes) of the first vertical string of switches SB and the third vertical string of switches SB to the global bit line GBL. In one configuration, more than one switch SB in the second vertical string of switches SB may be enabled if additional drive current is needed to access (e.g., read, write, program) larger areas of the memory array. In one configuration, in response to a voltage corresponding to logic state '0' provided through the switch control line SBL, a switch SB in the second vertical string of switches SB may be disabled to electrically decouple (e.g., disconnect, disengage, etc.) second electrodes (e.g., source electrodes) of the first vertical string of switches SB and the third vertical string of switches SB from the global bit line GBL.

In one configuration, in response to a voltage corresponding to logic state '1' provided through the switch control line SBL, a switch SB in the first vertical string of switches SB (e.g., SB_L [0][0][0], SB_L [0][0][1], SB_L [0][0][F-2], and SB_L [0][0][F]) may be enabled to electrically couple second electrodes (e.g., source electrodes) of the second vertical string of switches SB and the third vertical string of switches SB to a local bit line LBL_L (e.g., LBL_L[0]). In one configuration, more than one switch SB in the first vertical string of switches SB may be enabled if additional drive current is needed to access (e.g., read, write, program) larger areas of the memory array. In one configuration, in response to a voltage corresponding to logic state '0' provided through the switch control line SBL, a switch SB in the first vertical string of switches SB may be disabled to electrically decouple second electrodes of the second vertical string of switches SB and the third vertical string of switches SB from the local bit line LBL_L (e.g., LBL_L[0]).

In one configuration, in response to a voltage corresponding to logic state '1' provided through the switch control line SBL, a switch SB in the third vertical string of switches SB (e.g., SB_R [0][0][0], SB_R [0][0][1], SB_R [0][0][F-2], and SB_R [0][0][F]) may be enabled to electrically couple second electrodes (e.g., source electrodes) of the first vertical string of switches SB and the second vertical string of switches SB to a local bit line LBL_R (e.g., LBL_R[0]). In one configuration, more than one switch SB in the third vertical string of switches SB may be enabled if additional drive current is needed to access larger areas of the memory array. In one configuration, in response to a voltage corresponding to logic state '0' provided through the switch control line SBL, a switch SB in the third vertical string of switches SB may be disabled to electrically decouple second electrodes of the first vertical string of switches SB and the second vertical string of switches SB from the local bit line LBL_R (e.g., LBL_R[0]).

Each switch SS may be embodied as a transistor (e.g., MOSFET, GAAFET, FinFET, etc.). Each switch of the first vertical string of switches SS1_L (e.g., SS1_L [0][0][0], SS1_L [0][0][1], SS1_L [0][0][F−2], and SS1_L [0][0][F]) may include a first electrode (e.g., drain electrode) connected to first electrodes (e.g., drain electrode) of the second vertical string of switches SS2_L (e.g., SS2_L [0][0][0], SS2_L [0][0][1], SS2_L [0][0][F−2], SS1_L [0][0][F]); a second electrode (e.g., source electrode) connected to a global select line (e.g., GSL[0]); and a third electrode (e.g., gate electrode) connected to a corresponding switch control line SBL.

Each switch of the second vertical string of switches SS2_L (e.g., SS2_L [0][0][0], SS2_L [0][0][1], SS2_L [0][0][F−2], and SS2_L [0][0][F]) may include a first electrode (e.g., drain electrode) connected to first electrodes (e.g., drain electrode) of the first vertical string of switches SS1_L; a second electrode (e.g., source electrode) connected to a corresponding local select line (e.g., LSL_L[0]); and a third electrode (e.g., gate electrode) connected to a corresponding switch control line SBL.

Each switch of the first vertical string of switches SS1_R (e.g., SS1_R [0][0][0], SS1_R [0][0][1], SS1_R [0][0][F−2], and SS1_R [0][0][F]) may include a first electrode (e.g., drain electrode) connected to first electrodes (e.g., drain electrode) of the second vertical string of switches SS2_R (e.g., SS2_R [0][0][0], SS2_R [0][0][1], SS2_R [0][0][F−2], SS1_R [0][0][F]); a second electrode (e.g., source electrode) connected to a corresponding local select line (e.g., LSL_R[0]); and a third electrode (e.g., gate electrode) connected to a corresponding switch control line SBL.

Each switch of the second vertical string of switches SS2_R (e.g., SS2_R [0][0][0], SS2_R [0][0][1], SS2_R [0][0][F−2], and SS2_R [0][0][F]) may include a first electrode (e.g., drain electrode) connected to first electrodes (e.g., drain electrode) of the first vertical string of switches SS1_R; a second electrode (e.g., source electrode) connected to a corresponding global select line (e.g., GSL[0]); and a third electrode (e.g., gate electrode) connected to a corresponding switch control line SBL.

A switch control line SBL may be a metal rail extending along the X-direction to connect the memory controller 105 (e.g., gate line controller 114) to the gate electrodes of a corresponding switch SS. According to a voltage or a signal applied through the switch control line SBL, one or more switches SS connected to the switch control line SBL may be toggled (e.g., enabled or disabled).

In one configuration, in response to a voltage corresponding to logic state '1' provided through the switch control line SBL, a switch in the vertical string of switches SS1_L may be enabled to electrically couple (e.g., connect, engage, etc.) the first electrodes (e.g., drain electrodes) of the vertical string of switches SS2_L to the global select line GSL (e.g., GSL[0]). In one configuration, more than one switch in the vertical string of switches SS1_L may be enabled if additional current is needed to access (e.g., read, write, program) larger areas of the memory array. In one configuration, in response to a voltage corresponding to logic state '0' provided through the switch control line SBL, a switch in the vertical string of switches SS1_L may be disabled to electrically decouple (e.g., disconnect, disengage, etc.) first electrodes (e.g., drain electrodes) of the vertical string of switches SS2_L from the global select line GSL.

In one configuration, in response to a voltage corresponding to logic state '1' provided through the switch control line SBL, a switch in the vertical string of switches SS2_L may be enabled to electrically couple (e.g., connect, engage, etc.) the first electrodes (e.g., drain electrodes) of the vertical string of switches SS1_L to the local select line LSL_L (e.g., LSL_L[0]). In one configuration, more than one switch in the vertical string of switches SS2_L may be enabled if additional current is needed to access (e.g., read, write, program) larger areas of the memory array. In one configuration, in response to a voltage corresponding to logic state '0' provided through the switch control line SBL, a switch in the vertical string of switches SS2_L may be disabled to electrically decouple (e.g., disconnect, disengage, etc.) first electrodes (e.g., drain electrodes) of the vertical string of switches SS1_L from the local select line LSL_L In one configuration, in response to a voltage corresponding to logic state '1' provided through the switch control line SBL, a switch in the vertical string of switches SS2_R may be enabled to electrically couple (e.g., connect, engage, etc.) the first electrodes (e.g., drain electrodes) of the vertical string of switches SS1_R to the global select line GSL (e.g., GSL[0]). In one configuration, more than one switch in the vertical string of switches SS2_R may be enabled if additional current is needed to access (e.g., read, write, program) larger areas of the memory array. In one configuration, in response to a voltage corresponding to logic state '0' provided through the switch control line SBL, a switch in the vertical string of switches SS2_R may be disabled to electrically decouple (e.g., disconnect, disengage, etc.) first electrodes (e.g., drain electrodes) of the vertical string of switches SS1_R from the global select line GSL.

In one configuration, in response to a voltage corresponding to logic state '1' provided through the switch control line SBL, a switch in the vertical string of switches SS1_R may be enabled to electrically couple (e.g., connect, engage, etc.) the first electrodes (e.g., drain electrodes) of the vertical string of switches SS2_R to the local select line LSL_R (e.g., LSL_R[0]). In one configuration, more than one switch in the vertical string of switches SS1_R may be enabled if additional current is needed to access (e.g., read, write, program) larger areas of the memory array. In one configuration, in response to a voltage corresponding to logic state '0' provided through the switch control line SBL, a switch in the vertical string of switches SS1_R may be disabled to electrically decouple (e.g., disconnect, disengage, etc.) first electrodes (e.g., drain electrodes) of the vertical string of switches SS2_R from the local select line LSL_R In one configuration, the global select line GSL is a metal rail, at which corresponding switches SS_L, SS_R may be connected. The global select line GSL may extend along the Y-direction. In one implementation, the global select line GSL may be connected to a memory controller 105 (e.g., bit line controller 112). The global bit line GBL may be a metal rail, at which corresponding switches SB (e.g., SB_C) are connected. The global bit line GBL may extend along the Y-direction in parallel with the global select line GSL. In one implementation, the global bit line GBL may be connected to the memory controller 105 (e.g., bit line controller 112).

Thus, one or more switches SS_L, one or more switches SS_R, and one or more switches SB can be operated or configured according to a voltage or signal from the memory controller 105 (e.g., gate line controller 114) to electrically couple (sometimes referred to as a, "coupling method") a subset 310 of memory cells to corresponding global bit lines GBL and global select lines GSL selectively. For example, one or more switches SB_C and one or more switches SB_L can be enabled to electrically couple subsets 310[00] . . . 310[03] of memory cells to GBL[0]; and one or more switches SS1_L and SS2_L can be enabled to connect subsets 310[00] . . . 310[03] of memory cells to GSL[0]. Meanwhile, switches SB_R can be disabled to electrically decouple (sometimes referred to as a, "decoupling method") subsets 310[04] . . . 310[08] of memory cells from GBL[0]; and switches SS1_R and SS2_R can be disabled to disconnect subsets 310[04] . . . 310[08] of memory cells from GSL[0]. By electrically coupling a selected subset 310[XY] of memory cells to the global bit line GBL[X] and the global select line GSL[X] through the switches SB, SS_L, SS_R, the global bit line GBL[X] and the global select line GSL[X] may have a capacitive loading corresponding to the selected subset 310[XY] of memory cells instead of the set 310[X1] . . . 310[X3] (e.g., a plurality or all) of memory cells. Accordingly, the global bit lines GBL[X] and the global select lines GSL[X] may be implemented to provide voltages or current, without increased capacitive loading.

In one configuration, a memory array may be an asymmetric memory array. For example, as shown in FIG. 3A, the number of subsets (e.g., 310[00] . . . 310[03]) in the first set (e.g., Set_L) of memory cells is less than the number of subsets (e.g., 310[04] . . . 310[08]) in the second set (e.g., Set_R) of memory cells. Accordingly, the memory controller may select the first set of memory cells for applications using a low density of memory cells and/or a high speed access to the memory cells. Alternatively, the memory controller may select the second set of memory cells for applications using a high density of memory cells and/or instances where low speed access to the memory cells is not a concern.

In one configuration, a memory array may be a symmetric memory array. For example, the number of subsets (e.g., 310[00] . . . 310[03]) in the first set of memory cells could be equal to the number of subsets (e.g., 310[04] . . . 310[07]) in the second set of memory cells. A symmetric memory array may be useful for BL loading reduction.

Although switches SB, switches SS_L, and switches SS_R are shown in FIG. 3A in a particular arrangement, the switches may be insert in any position in the memory array 210 for BL loading reduction (e.g., Set_L) or high density design (e.g., Set_R). The GBL and/or GSL may be positioned in the memory array 210 in any location (e.g., left, center, right) for improved efficiency and/or GBL/GSL loading reduction.

Figure 3B:
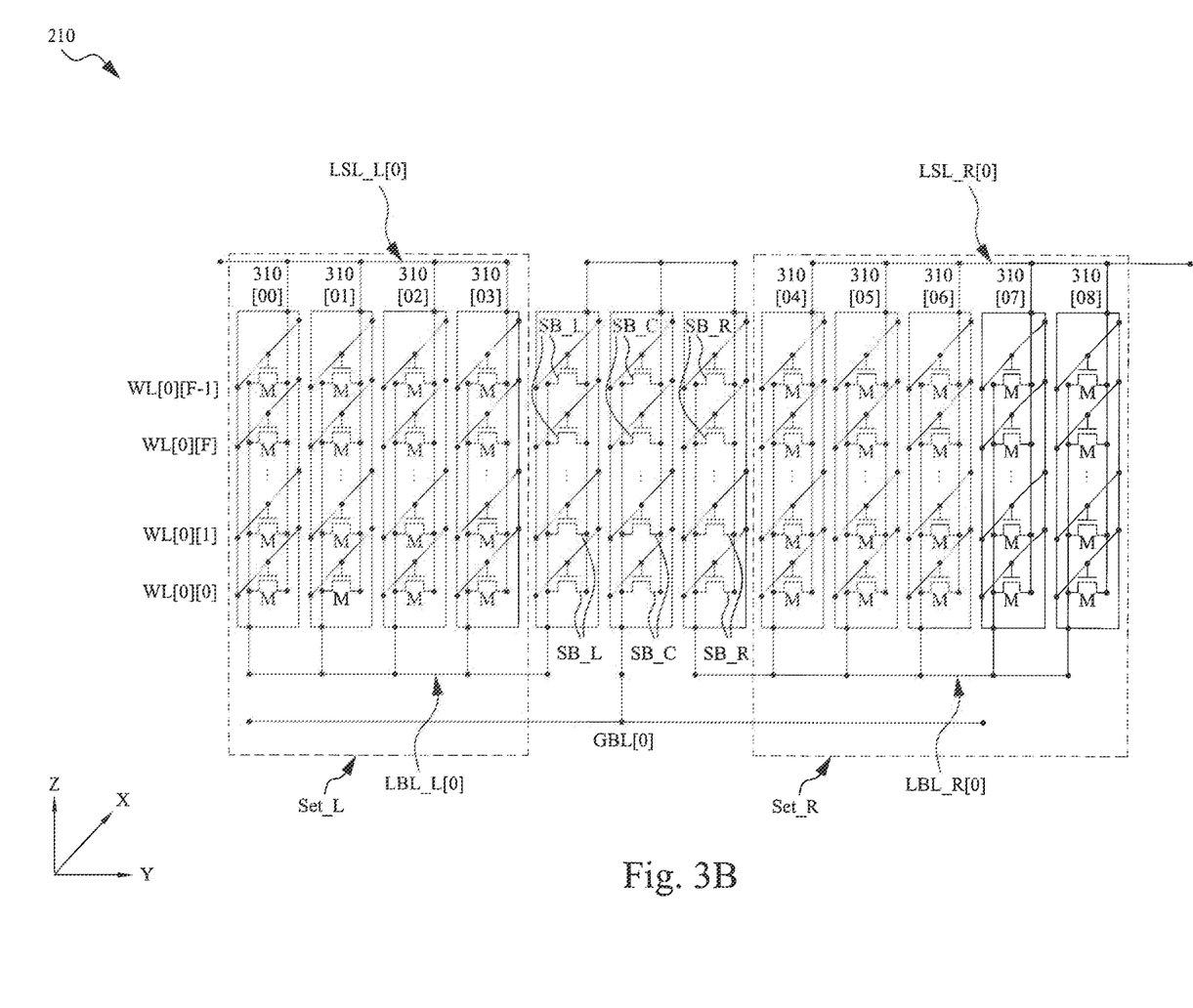
FIG. 3B is a diagram showing a portion of a three-dimensional memory array 210 including switches coupled to global bit lines GBL for reducing capacitive loading, in accordance with one embodiment.

In some embodiments, the memory array 210 includes the switches SB, but may lack the switches SS_L and/or switches SS_R. For example, FIG. 3B is a diagram showing a portion of a three-dimensional memory array 210 including switches coupled to global bit lines GBL for reducing capacitive loading, in accordance with one embodiment. As shown, the memory array 210 includes the switches SB as shown in FIG. 3A, but switches SS_L, SS_R are omitted and local select lines LSL_L (e.g., LSL_L[0]) and LSL_R (e.g., LSL_R[0]) are connected to respective ports of the memory array 210, thereby allowing the memory controller 210 to independently drive the local select lines. In one configuration, the local select lines LSL_L (e.g., LSL_L[0]) and LSL_R (e.g., LSL_R[0]) may be connected to the same port of the memory array 210, thereby allowing the memory controller 210 to drive both the local select lines using the least number of ports and/or drivers.

Figure 3C:
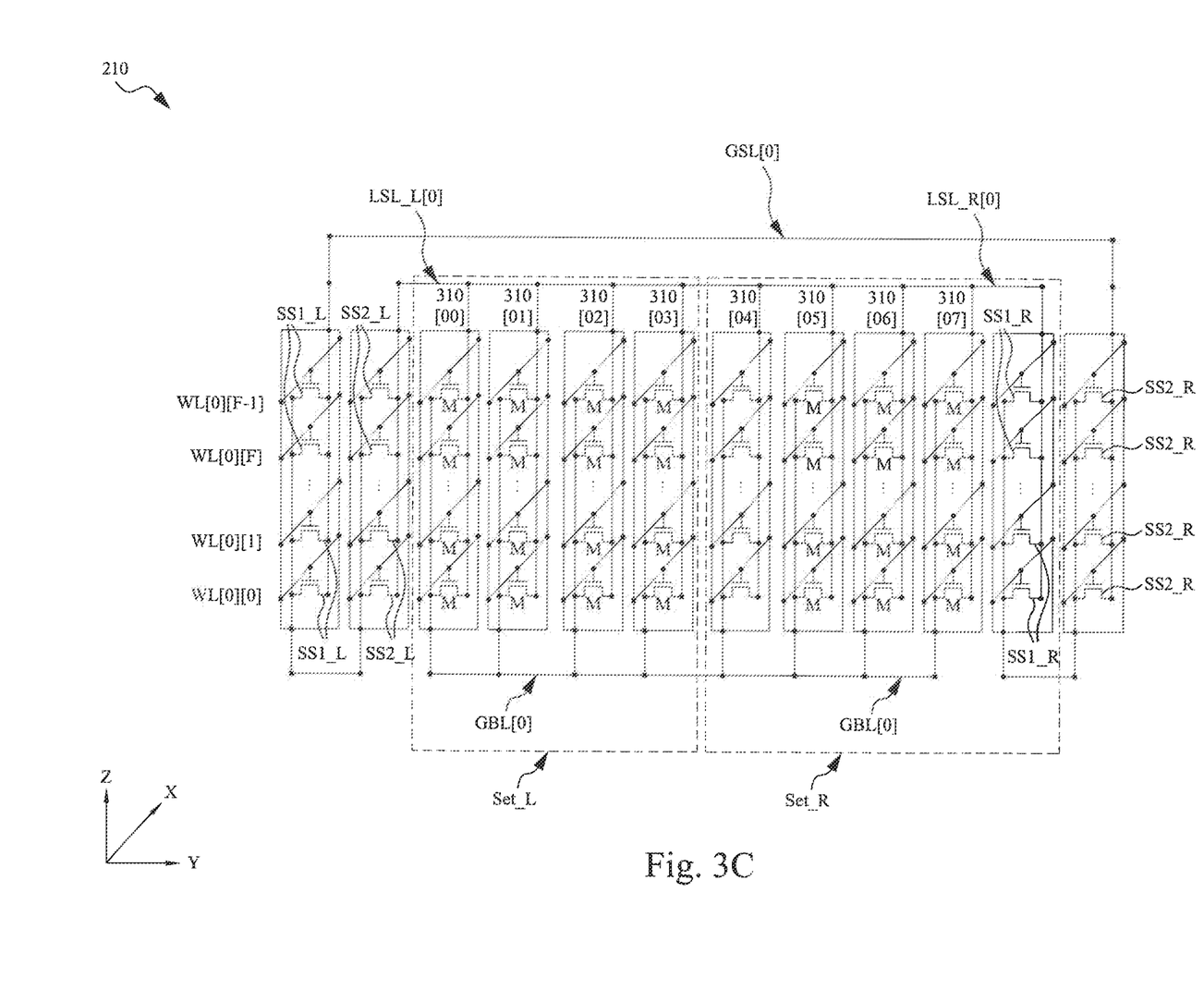
FIG. 3C is a diagram showing a portion of a three-dimensional memory array 210 including switches coupled to local select lines LSL for reducing capacitive loading, in accordance with one embodiment.

In some embodiments, the memory array 210 includes the switches SS_L, SS_R, but may lack the switches SB. For example, FIG. 3C is a diagram showing a portion of a three-dimensional memory array 210 including switches coupled to local select lines for reducing capacitive loading, in accordance with one embodiment. As shown, the memory array 210 includes the switches SS_L, SS_R as shown in FIG. 3A, but switches SB are omitted and local select lines LBL_L (e.g., LBL_L[0]) and LBL_R (e.g., LBL_R[0]) are connected to global bit line (e.g., GBL[0]). Omitting the switches SS_L, SS_R from the design could help to reduce routing complexity and/or achieve SL loading reduction for high-speed (e.g., a faster access to memory array 210) applications.

In some embodiments, the M cells and/or switches SB, SS_L, SS_R in the memory array 210 depicted in any of FIG. 3A, FIG. 3B, FIG. 3C may be embodied as P-type metal-oxide-semiconductor field effect transistors (PMOS). In some embodiments, the M cells and/or switches SB, SS_L, SS_R in the memory array 210 depicted in any of FIG. 3A, FIG. 3B, FIG. 3C may be embodied as N-type metal-oxide-semiconductor field effect transistors (NMOS).

In some embodiments, the switches SB, SS_L, SS_R in the memory array 210 depicted in any of FIG. 3A, FIG. 3B, FIG. 3C may be inserted into any position in the memory array 210 for bit line loading reduction (e.g., low density design and/or high speed access) or high density design (e.g., low speed access). In some embodiments, the size of a bit line BL (local or global) and/or a select line SL (local or global) in any of the memory arrays of FIG. 3A, FIG. 3B, FIG. 3C can be the same size as a memory bit-cell, smaller than a memory bit-cell, or larger than a memory bit-cell. In some embodiments, a bit line BL (local or global) and/or a select line SL (local or global) in the memory array 210 depicted in any of FIG. 3A, FIG. 3B, FIG. 3C can be one or multiple to enhance driving current. In some embodiments, a bit line BL (local or global) and/or a select line SL (local or global) in the memory array 210 depicted in any of FIG. 3A, FIG. 3B, FIG. 3C can be individually controller.

Figure 4:
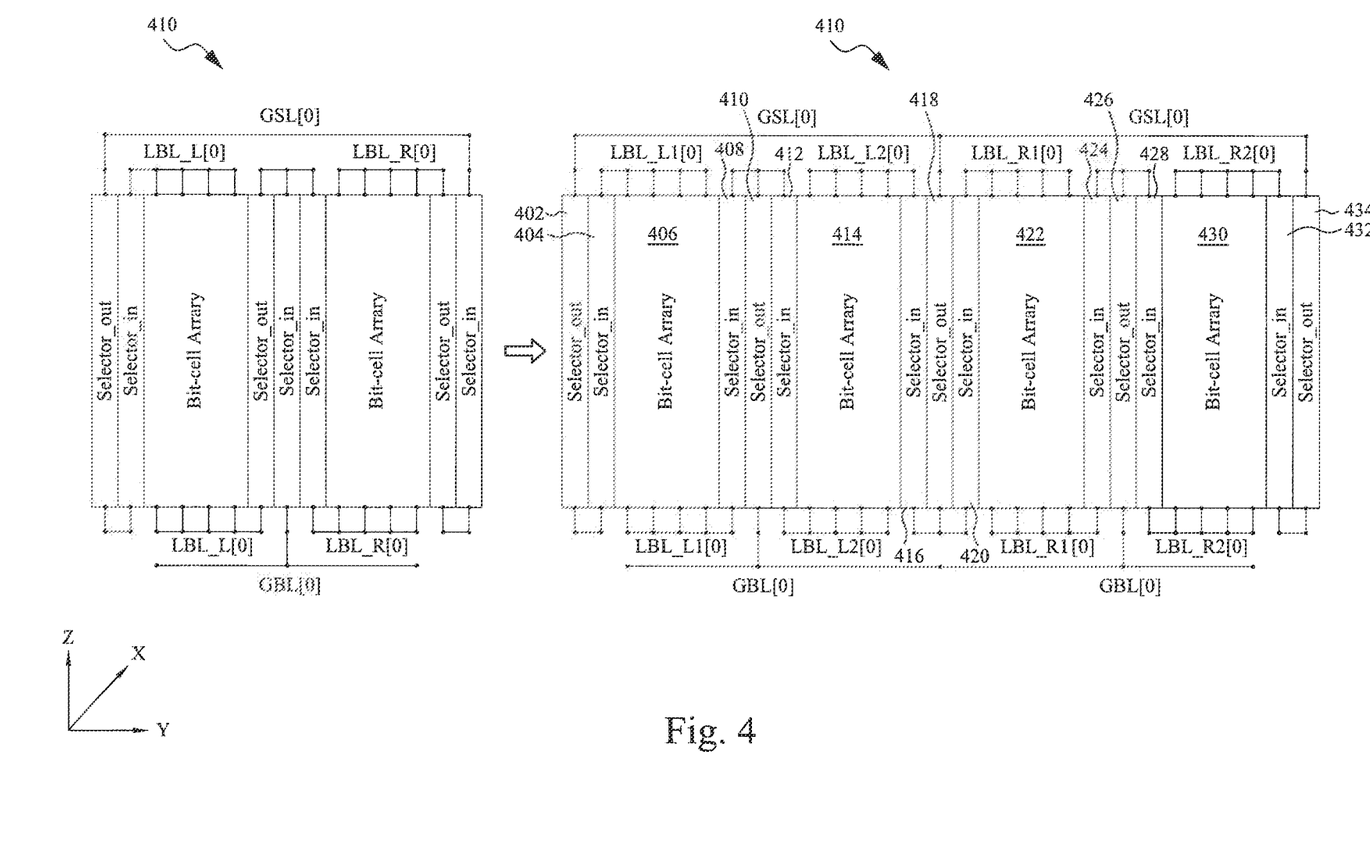
FIG. 4 is a diagram showing a portion of a three-dimensional memory array 400 including switches that split bit-cell array into multi cell for reducing capacitive loading, in accordance with one embodiment.

FIG. 4 is a diagram showing a portion of a three-dimensional memory array 400 including selectors that split a bit-cell array into multi cell for reducing capacitive loading, in accordance with one embodiment. As shown, the three-dimensional memory array 400 includes a plurality of selector_outs (e.g., switches SS_L, switches SS_R, switches SB), a plurality of selector_ins (e.g., switches SS_L, switches SS_R, switches SB), and a plurality of bit-cell arrays (e.g., memory array 210). For example, a first electrode of selector_out 402 is coupled to a global select line GSL[0]. A second electrode of selector_out 402 is coupled to a second electrode of a selector_in 404, whose first electrode is coupled to LSL_L1[0], which is coupled to first electrodes of bit-cell array 406, whose second electrodes are coupled to LBL_L1[0], which is coupled to a second electrode of selector_in 408, whose first electrode is coupled to first electrodes of selector_out 410 and selector_in 412. A second electrode of selector_out 410 is coupled to GBL[0], which is coupled to a second electrode of selector_out 426, whose first electrode is coupled to first electrodes of selector_in 424 and selector_in 428.

A second electrode of selector_in 412 is coupled to LBL_L2[0], which is coupled to second electrodes of bit-cell array 414, whose first electrodes are coupled to LSL_L2[0], which is coupled to first electrode of selector_in 416, whose second electrode is coupled to second electrodes of selector_out 418 and selector_in 420. A first electrode of selector_in 420 is coupled to LSL_R1[0], which is coupled to first electrodes of bit-cell array 422, whose second electrodes are coupled to LBL_R1[0], which is coupled to a second electrode of selector_in 424, whose first electrode is coupled to first electrodes of selector_out 426 and selector_in 428. A second electrode of selector_in 428 is coupled to LBL_R2[0], which is coupled second electrodes of bit-cell array 430, whose first electrodes are coupled to LSL_R2[0], which is coupled to first electrode of selector_in 432, whose second electrode is coupled to second electrode of selector_out 434, whose first electrode is coupled to GSL[0].

By splitting a bit-cell array into multi cell via a multi selector (e.g., switches SB, SS_L, and/or SS_R), a significant reduction in BL/SL loading resulting in extra high-speed memory may be achieved, and without serious routing penalty. The reduction in BL/SL loading also achieves extra high speed memory.

Figure 5:
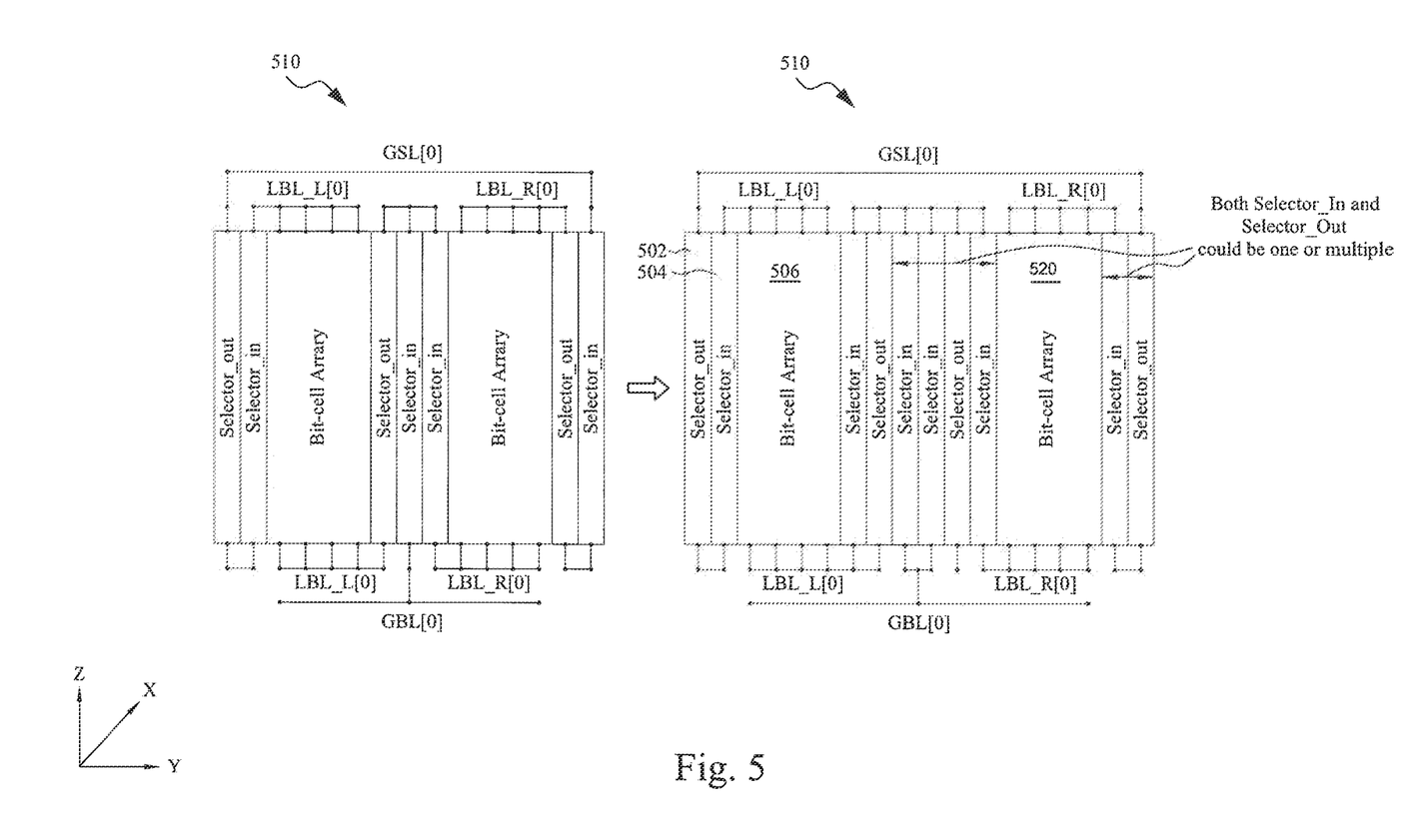
FIG. 5 is a diagram showing a portion of a three-dimensional memory array 500 including selectors in and selectors out that are designed as one or more for BL/SL driver enhancement, in accordance with one embodiment.

FIG. 5 is a diagram showing a portion of a three-dimensional memory array 500 including selectors in and selectors out that are designed as one or more for BL/SL driver enhancement, in accordance with one embodiment. As shown, the three-dimesional memory array 500 includes a plurality of selector_outs (e.g., switches SS_L, switches SS_R, switches SB), a plurality of selector_ins (e.g., switches SS_L, switches SS_R, switches SB), and a plurality of bit-cell arrays (e.g., memory array 210). For example, a first electrode of selector_out 502 is coupled to a global select line GSL[0]. A second electrode of selector_out 502 is coupled to a second electrode of a selector_in 504, whose first electrode is coupled to LSL_L[0], which is coupled to first electrodes of bit-cell array 506, whose second electrodes are coupled to LBL_L[0], which is coupled to second electrodes of selector_in 508 and selector_in 510. First electrodes of selector_in 508 and selector_in 510 are coupled to first electrodes of selector_out 512, selector_out 514, selector_in 516, and selector_in 518. Second electrodes of selector_out 512 and selector_out 514 are coupled to GBL[0]. Second electrodes of selector_in 516 and selector_in 518 are coupled to LBL_R[0], which is coupled to second electrodes of bit-cell array 520, whose first electrodes are coupled to LSL_R[0], which is coupled to first electrode of selector_in 522, whose second electrode is coupled to second electrode of selector_out 524, whose first electrode is coupled to GSL[0].

In one configuration, any of selector_outs 512, 514, 524 may be combined into a single selector_out. In one configuration, any of selector_ins 516, 518, 522 may be combined into a single selector_in. In one configuration, any selector_ins 516, 518, 522 and any of selector_outs 512, 514, 524 may be combined into a single selector_in/selector_out. By combining (or sharing) selector_ins and/or selector_outs, an enhanced BL/SL driver may be achieved. Furthermore, combining selector_ins and/or selector_outs may result in improved area efficiency.

3. Method(s) for Implementing the Illustrative Embodiments

Figure 6:
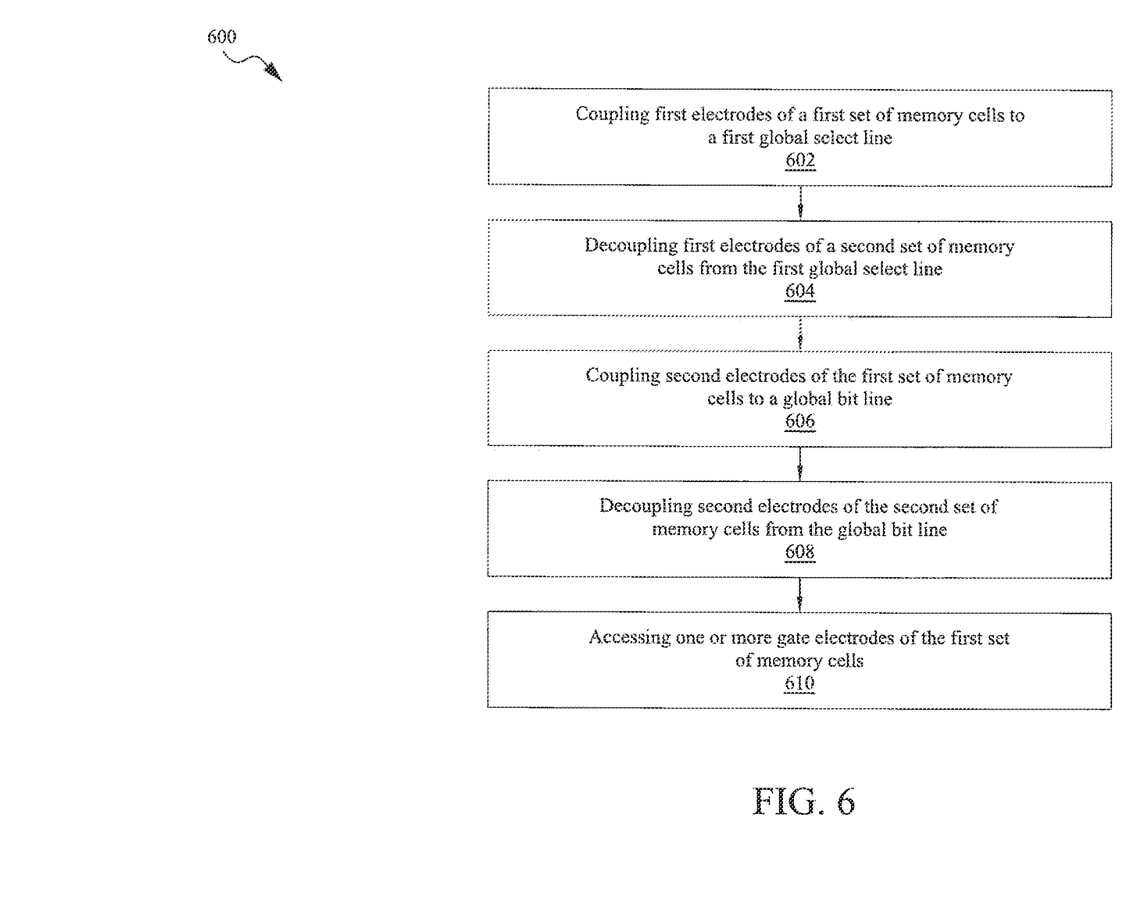
FIG. 6 is a flowchart showing a method of accessing and/or operating a memory cell and/or a memory array, in accordance with some embodiments.

FIG. 6 is a flowchart showing a method 600 of accessing and/or operating a memory cell (e.g., memory cell 125) and/or a memory array (e.g., memory array 210), in accordance with some embodiments. The method 600 may be performed by the memory controller 105 of FIG. 1. In some embodiments, the method 600 is performed by other entities. In some embodiments, the method 600 includes more, fewer, or different operations than shown in FIG. 6.

In an operation 602, the memory controller 105 enables (e.g., selects) one or more switches during a first time period to cause a coupling of first electrodes of a first subset of memory cells to a first global select line. For example, the memory controller may enable one or more switches of SS2_L to electrically couple first electrodes of switches SS1_L to first electrodes of the first subset (e.g., 310[00] . . . 310[03]) of memory cells M; and/or enable the corresponding one or more switches of SS1_L to electrically couple first electrodes of the SS1_L to global select line (e.g., GSL[0]).

In an operation 604, the memory controller 105 disables (e.g., deselects) one or more switches during the first time period to cause a decoupling of first electrodes of a second subset of memory cells from the first global select line. For example, the memory controller may disable one or more switches of SS1_R to electrically decouple (e.g., disconnect) first electrodes of switches SS2_R from first electrodes of the second subset (e.g., 310[04] . . . 310[08]) of memory cells M; and/or disable the corresponding one or more switches of SS2_R to electrically decouple first electrodes of the SS2_R from the global select line (e.g., GSL[0]).

In an operation 606, the memory controller 105 enables one or more switches during the first time period to cause a coupling of second electrodes of the first set of memory cells to a global bit line. For example, the memory controller may enable one or more switches of SB_C to electrically couple a global bit line (e.g., GBL[0]) to second electrodes of switches SB_L and second electrodes of switches SB_R; and/or enable one or more switches of SB_L to electrically couple second electrodes of the first subset of memory cells to the global bit line (e.g., GBL[0]).

In an operation 608, the memory controller 105 disables one or more switches during the first time period to cause a decoupling of second electrodes of the second set of memory cells from a global bit line. For example, the memory controller may disable one or more switches of SB_C to electrically decouple a global bit line (e.g., GBL[0]) from second electrodes of switches SB_L and second electrodes of switches SB_R; and/or disable one or more switches of SB_R to electrically decouple second electrodes of the second subset of memory cells from the global bit line (e.g., GBL[0]).

In an operation 610, the memory controller 105 accesses (e.g., configures, programs, reads, writes), during the first time period, one or more memory cells of the first subset of memory cells. For example, the memory controller 105 may apply a voltage, current, or pulse to the first subset of memory cells through its respective word line (e.g., WL[X][Y] or WL[X][Y]) to program the first subset of memory cells or cause the first subset of memory cells to conduct current according to the programmed data. Since the second subset of memory cells are not coupled to the global bit line and/or the global select line, the memory controller 105 may access the first subset of memory cells without being loaded by the capacitance of the second subset of memory cells.

4. Computing System for Implementing the Illustrative Embodiments

Figure 7:
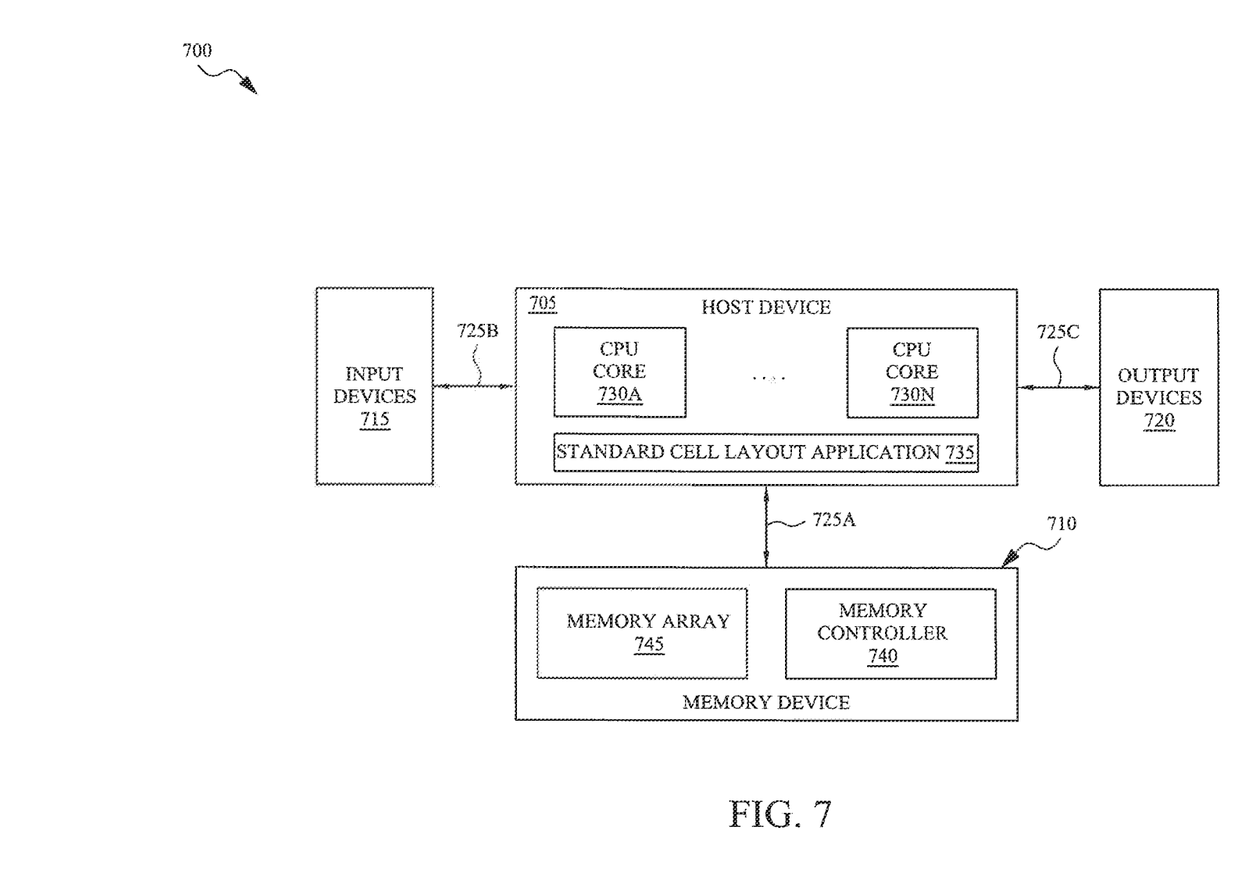
FIG. 7 is an example block diagram of a computing system 700, in accordance with some embodiments of the disclosure.

FIG. 7 is an example block diagram of a computing system 700, in accordance with some embodiments of the disclosure. The computing system 700 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 700 includes a host device 705 associated with a memory device 710. The host device 705 may be configured to receive input from one or more input devices 715 and provide output to one or more output devices 720. The host device 705 may be configured to communicate with the memory device 710, the input devices 715, and the output devices 720 via appropriate interfaces 725A, 725B, and 725C, respectively. The computing system 700 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 705.

The input devices 715 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 705 and that allows an external source, such as a user (e.g., a circuit or layout designer), to enter information (e.g., data) into the host device and send instructions to the host device. Similarly, the output devices 720 may include a variety of output technologies such as external memories, printers, speakers, displays, microphones, light emitting diodes, headphones, video devices, and any other output peripherals that are configured to receive information (e.g., data) from the host device 705. The "data" that is either input into the host device 705 and/or output from the host device may include any of a variety of textual data, circuit data, signal data, semiconductor device data, graphical data, combinations thereof, or other types of analog and/or digital data that is suitable for processing using the computing system 700.

The host device 705 includes or is associated with one or more processing units/processors, such as Central Processing Unit ("CPU") cores 730A-730N. The CPU cores 730A-730N may be implemented as an Application Specific Integrated Circuit ("ASIC"), Field Programmable Gate Array ("FPGA"), or any other type of processing unit. Each of the CPU cores 730A-730N may be configured to execute instructions for running one or more applications of the host device 705. In some embodiments, the instructions and data to run the one or more applications may be stored within the memory device 710. The host device 705 may also be configured to store the results of running the one or more applications within the memory device 710. Thus, the host device 705 may be configured to request the memory device 710 to perform a variety of operations. For example, the host device 705 may request the memory device 710 to read data, write data, update or delete data, and/or perform management or other operations. One such application that the host device 705 may be configured to run may be a standard cell application 735. The standard cell application 735 may be part of a computer aided design or electronic design automation software suite that may be used by a user of the host device 705 to use, create, or modify a standard cell of a circuit. In some embodiments, the instructions to execute or run the standard cell application 735 may be stored within the memory device 710. The standard cell application 735 may be executed by one or more of the CPU cores 730A-730N using the instructions associated with the standard cell application from the memory device 710. In one example, the standard cell application 735 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 7, the memory device 710 includes a memory controller 740 that is configured to read data from or write data to a memory array 745. The memory array 745 may include a variety of volatile and/or non-volatile memories. For example, in some embodiments, the memory array 745 may include NAND flash memory cores. In other embodiments, the memory array 745 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 745 may be individually and independently controlled by the memory controller 740. In other words, the memory controller 740 may be configured to communicate with each memory within the memory array 745 individually and independently. By communicating with the memory array 745, the memory controller 740 may be configured to read data from or write data to the memory array in response to instructions received from the host device 705. Although shown as being part of the memory device 710, in some embodiments, the memory controller 740 may be part of the host device 705 or part of another component of the computing system 700 and associated with the memory device. The memory controller 740 may be implemented as a logic circuit in either software, hardware, firmware, or combination thereof to perform the functions described herein. For example, in some embodiments, the memory controller 740 may be configured to retrieve the instructions associated with the standard cell application 735 stored in the memory array 745 of the memory device 710 upon receiving a request from the host device 705.

It is to be understood that only some components of the computing system 700 are shown and described in FIG. 7. However, the computing system 700 may include other components such as various batteries and power sources, networking interfaces, routers, switches, external memory systems, controllers, etc. Generally speaking, the computing system 700 may include any of a variety of hardware, software, and/or firmware components that are needed or considered desirable in performing the functions described herein. Similarly, the host device 705, the input devices 715, the output devices 720, and the memory device 710 including the memory controller 740 and the memory array 745 may include other hardware, software, and/or firmware components that are considered necessary or desirable in performing the functions described herein.

One aspect of this description relates to a memory array. In some embodiments, the memory array includes a first set of memory cells and a second set of memory cells, each set of memory cells extending across a plurality of layers of the memory array, each layer including a memory cell of the first set of memory cells and a memory cell of the second set of memory cells. In some embodiments, the memory array includes a first group of switches, each including: a first electrode connected to first electrodes of the first subset of memory cells, and a second electrode. In some embodiments, the memory array includes a second group of switches, each including: a first electrode connected to first electrodes of the second subset of memory cells, and a second electrode. In some embodiments, the memory array includes a third group of switches, each including: a first electrode connected to a first global bit line, and a second electrode connected to the second electrodes of the first group of switches and the second electrodes of the second group of switches.

One aspect of this description relates to a memory system. In some embodiments, the memory array includes a first set of memory cells and a second set of memory cells, each set of memory cells extending across a plurality of layers of the memory array, each layer including a memory cell of the first set of memory cells and a memory cell of the second set of memory cells. In some embodiments, the memory array includes a first group of switches, each including: a first electrode, and a second electrode connected to a global select line; a second group of switches, each including: a first electrode, and a second electrode connected to the global select line. In some embodiments, the memory array includes a third group of switches, each including: a first electrode connected to the first electrode of the first group of switches, and a second electrode connected to first electrodes of the first subset of memory cells; and a fourth group of switches, each including: a first electrode connected to the first electrode of the second group of switches, and a second electrode connected to first electrodes of the second subset of memory cells.

One aspect of this description relates to a memory system. In some embodiments, the memory system includes a memory array including: a first group of switches; a first set of memory cells having first electrodes coupled to a first local select line and second electrodes coupled to the first group of switches; a second set of memory cells having first electrodes coupled to a second local select line and second electrodes coupled to the first group of switches. In some embodiments, the memory system includes a controller connected to the memory array, the controller is to toggle at least one switch of the first group of switches to electrically couple a global bit line to the second electrodes of the first set of memory cells.

One aspect of this description relates to a method of operating a memory system. In some embodiments, the method includes coupling, during a first time period, first electrodes of a first set of memory cells to a first global select line. In some embodiments, the method includes decoupling, during the first time period, first electrodes of a second set of memory cells from the first global select line. In some embodiments, the method includes coupling, during the first time period, second electrodes of the first set of memory cells to a global bit line. In some embodiments, the method includes decoupling, during the first time period, second electrodes of the second set of memory cells from the global bit line. In some embodiments, the method includes accessing, during the first time period, one or more gate electrodes of the first set of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
   a first set of memory cells and a second set of memory cells, each set of memory cells extending across a plurality of layers of the memory array, each layer including a memory cell of the first set of memory cells and a memory cell of the second set of memory cells;
   a first group of switches, each including:
      a first electrode connected to first electrodes of the first subset of memory cells, and
      a second electrode;
   a second group of switches, each including:
      a first electrode connected to first electrodes of the second subset of memory cells, and
      a second electrode; and
   a third group of switches, each including:
      a first electrode connected to a first global bit line, and
      a second electrode connected to the second electrodes of the first group of switches and the second electrodes of the second group of switches.

2. The memory array of claim 1, further comprising:
   a fourth group of switches, each including:
      a first electrode, and
      a second electrode connected to a first global select line;
   a fifth group of switches, each including:
      a first electrode connected to first electrodes of the fourth group of switches, and
      a second electrode connected to second electrodes of the first subset of memory cells.

3. The memory array of claim 2, further comprising:
   a sixth group of switches, each including:
      a first electrode, and
      a second electrode connected to the first global select line;
   a seventh group of switches, each including:
      a first electrode connected to first electrodes of the sixth group of switches, and
      a second electrode connected to second electrodes of the second subset of memory cells.

4. The memory array of claim 1,
   wherein the second electrodes of the first subset of memory cells are connected to a first local select line, and
   wherein the second electrodes of the second subset of memory cells are connected to a second local select line.

5. The memory array of claim 1,
   wherein a count of the first set of memory cells is different than a count of the second set of memory cells.

6. The memory array of claim 1,
   wherein each gate electrode of each switch of the first group of switches is connected to a respective switch control line of a plurality of switch control lines,
   wherein each gate electrode of each switch of the second group of switches is connected to a respective switch control line of the plurality of switch control lines, and
   wherein each gate electrode of each switch of the third group of switches is connected to a respective switch control line of the plurality of switch control lines.

7. The memory array of claim 1,
   wherein gate electrodes of the first group of switches are connected to a first switch control line, wherein gate electrodes of the second group of switches are connected to a second switch control line, and
wherein gate electrodes of the third group of switches are connected to a third switch control line.

8. The memory array of claim 1, wherein the first set of memory cells and the first switch correspond to matching types of transistors, wherein the types of transistors include N-type metal-oxide-semiconductor field effect transistors (NMOS) or P-type metal-oxide-semiconductor field effect transistors (PMOS).

9. A memory array comprising:
a first set of memory cells and a second set of memory cells, each set of memory cells extending across a plurality of layers of the memory array, each layer including a memory cell of the first set of memory cells and a memory cell of the second set of memory cells;
a first group of switches, each including:
a first electrode, and
a second electrode connected to a global select line;
a second group of switches, each including:
a first electrode, and
a second electrode connected to the global select line;
a third group of switches, each including:
a first electrode connected to the first electrode of the first group of switches, and
a second electrode connected to first electrodes of the first subset of memory cells; and
a fourth group of switches, each including:
a first electrode connected to the first electrode of the second group of switches, and
a second electrode connected to first electrodes of the second subset of memory cells.

10. The memory array of claim 9,
wherein second electrodes of the first subset of memory cells are connected to a global bit line, and
wherein second electrodes of the second subset of memory cells are connected to the global bit line.

11. The memory array of claim 9,
wherein each gate electrode of each switch of the first group of switches is connected to a respective switch control line of a plurality of switch control lines,
wherein each gate electrode of each switch of the second group of switches is connected to a respective switch control line of the plurality of switch control lines,
wherein each gate electrode of each switch of the third group of switches is connected to a respective switch control line of the plurality of switch control lines, and
wherein each gate electrode of each switch of the fourth group of switches is connected to a respective switch control line of the plurality of switch control lines.

12. The memory array of claim 9,
wherein gate electrodes of the first group of switches are connected to a first switch control line,
wherein gate electrodes of the second group of switches are connected to a second switch control line,
wherein gate electrodes of the third group of switches are connected to a third switch control line, and
wherein gate electrodes of the fourth group of switches are connected to a fourth switch control line.

13. A memory system comprising:
a memory array including:
a first group of switches;
a first set of memory cells having first electrodes coupled to a first local select line and second electrodes coupled to the first group of switches;
a second set of memory cells having first electrodes coupled to a second local select line and second electrodes coupled to the first group of switches; and
a controller connected to the memory array, the controller is to:
toggle at least one switch of the first group of switches to electrically couple a global bit line to the second electrodes of the first set of memory cells.

14. The memory system of claim 13, further comprising a second group of switches and wherein the controller is further to:
toggle at least one switch of the second group of switches to electrically decouple the global bit line from the second electrodes of the second set of memory cells.

15. The memory system of claim 14, further comprising a third group of switches and wherein the controller is further to:
toggle at least one switch of the third group of switches to electrically decouple the global bit line from the second electrodes of the first set of memory cells.

16. The memory system of claim 13, further comprising a second group of switches and wherein the controller is further to:
toggle at least one switch of the second group of switches to electrically couple the first local select line to a global select line.

17. The memory system of claim 16, further comprising a third group of switches and wherein the controller is further to:
toggle at least one switch of the third group of switches to electrically decouple the first local select line from the global select line.

18. The memory system of claim 16, further comprising a third group of switches and wherein the controller is further to:
toggle at least one switch of the third group of switches to electrically decouple the second local select line from the global select line.

19. The memory system of claim 18, further comprising a fourth group of switches and wherein the controller is further to:
toggle at least one switch of the fourth group of switches to electrically couple the at least one switch of the third group of switches to the global select line.

20. The memory system of claim 13, wherein the first set of memory cells and the first switch correspond to matching types of transistors, wherein the types of transistors include N-type metal-oxide-semiconductor field effect transistors (NMOS) or P-type metal-oxide-semiconductor field effect transistors (PMOS).

* * * * *